United States Patent
Hua et al.

(10) Patent No.: US 11,222,863 B2
(45) Date of Patent: Jan. 11, 2022

(54) TECHNIQUES FOR DIE STACKING AND ASSOCIATED CONFIGURATIONS

(71) Applicant: Intel Corporation, Santa Clara, CA (US)

(72) Inventors: Fay Hua, Fremont, CA (US); Christopher M. Pelto, Beaverton, OR (US); Valluri R. Rao, Saratoga, CA (US); Mark T. Bohr, Aloha, OR (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 683 days.

(21) Appl. No.: 16/080,989

(22) PCT Filed: Apr. 1, 2016

(86) PCT No.: PCT/US2016/025672
§ 371 (c)(1),
(2) Date: Aug. 29, 2018

(87) PCT Pub. No.: WO2017/171863
PCT Pub. Date: Oct. 5, 2017

(65) Prior Publication Data
US 2021/0193613 A1 Jun. 24, 2021

(51) Int. Cl.
*H01L 23/00* (2006.01)
*H01L 21/02* (2006.01)
(Continued)

(52) U.S. Cl.
CPC ........ *H01L 24/94* (2013.01); *H01L 21/02381* (2013.01); *H01L 21/02389* (2013.01);
(Continued)

(58) Field of Classification Search
CPC ..... H01L 25/0657; H01L 25/50; H01L 24/94; H01L 21/78; H01L 25/07; H01L 2924/35
See application file for complete search history.

(56) References Cited

U.S. PATENT DOCUMENTS 8,415,783 B1   4/2013   Rahman et al.
8,617,927 B1   12/2013  Margomenos et al.
(Continued)

FOREIGN PATENT DOCUMENTS

FR    2968834 A1    6/2012

OTHER PUBLICATIONS

International Search Report and Written Opinion dated Nov. 21, 2016 for International Patent Application No. PCT/US2016/025672, 13 pages.
(Continued)

*Primary Examiner* — Moazzam Hossain
*Assistant Examiner* — Stanetta D Isaac
(74) *Attorney, Agent, or Firm* — Schwabe, Williamson & Wyatt, P.C.

(57) ABSTRACT

Embodiments of the present disclosure describe techniques for fabricating a stacked integrated circuit (IC) device. A first wafer that includes a plurality of first IC dies may be sorted to identify first known good dies of the plurality of first IC dies. The first wafer may be diced to singulate the first IC dies. A second wafer that includes a plurality of second IC dies may be sorted to identify second know good dies of the plurality of second IC dies. The first known good dies may be bonded to respective second known good dies of the second wafer. In some embodiments, the first known good dies may be thinned after bonding the first know good dies to the second wafer. Other embodiments may be described and/or claimed.

16 Claims, 11 Drawing Sheets

(51) Int. Cl.
*H01L 21/768* (2006.01)
*H01L 21/78* (2006.01)
*H01L 25/065* (2006.01)
*H01L 25/00* (2006.01)

(52) U.S. Cl.
CPC ........ *H01L 21/76898* (2013.01); *H01L 21/78* (2013.01); *H01L 25/0657* (2013.01); *H01L 25/50* (2013.01); *H01L 2924/35* (2013.01)

(56) References Cited

U.S. PATENT DOCUMENTS

| | | |
|---|---|---|
| 2004/0188819 A1 | 9/2004 | Farnworth et al. |
| 2008/0142959 A1 | 6/2008 | Demulder et al. |
| 2009/0079090 A1 | 3/2009 | Pressel et al. |
| 2009/0197372 A1 | 8/2009 | Han et al. |
| 2015/0132869 A1 | 5/2015 | England et al. |
| 2015/0255371 A1 | 9/2015 | Yap et al. |
| 2016/0027719 A1 | 1/2016 | Chen et al. |

OTHER PUBLICATIONS

Extended European Search Report dated Oct. 30, 2019 for European Patent Application No. 16897402.0, 9 pages.

TECHNIQUES FOR DIE STACKING AND ASSOCIATED CONFIGURATIONS

CROSS REFERENCE TO RELATED APPLICATIONS

The present application is a national phase entry under 35 U.S.C. § 371 of International Application No. PCT/US2016/025672, filed Apr. 1, 2016, entitled "TECHNIQUES FOR DIE STACKING AND ASSOCIATED CONFIGURATIONS", which designated, among the various States, the United States of America. The PCT/US2016/025672 Application is hereby incorporated by reference in its entirety.

FIELD

Embodiments of the present disclosure generally relate to the field of integrated circuits, and more particularly, to techniques for die stacking and associated configurations.

BACKGROUND

Driven by the desire for smaller and thinner electronics with more functionality, heterogenous dies may be coupled together tightly. However, current techniques for stacking heterogenous dies, such as pick and place, require the dies to be of a sufficient thickness. In a lot of cases, electrical performance of functional dies drifts when the dies are very thin due to changes in the stress field on the die. Additionally, if either die fails, then the entire package fails, leading to lower yield. Furthermore, in dies that use through-silicon vias (TSVs), manufacturing of the TSVs is expensive, primarily due to etching and plating of high aspect ratio TSVs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
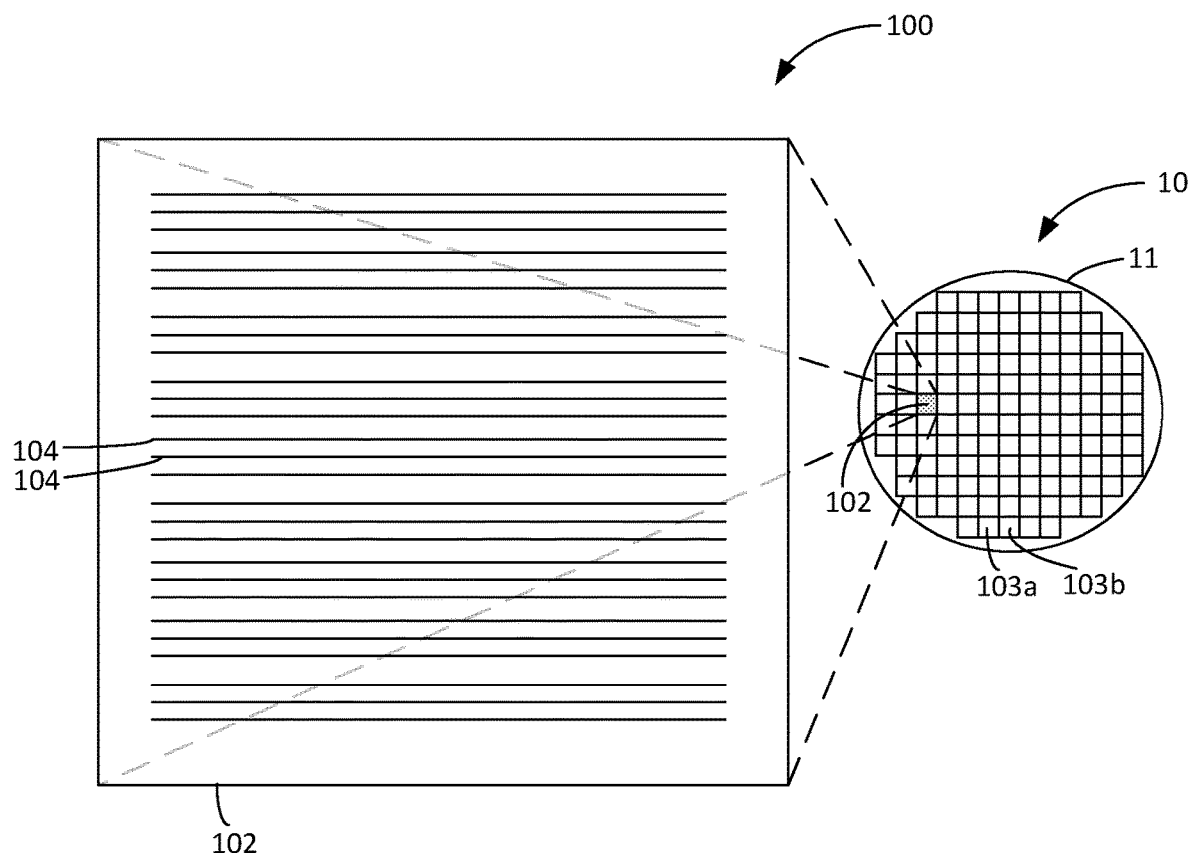
FIG. 1 schematically illustrates a top view of an example die in wafer form and in singulated form, in accordance with some embodiments.

Embodiments of the present disclosure describe techniques for stacking integrated circuit (IC) dies, and associated configurations. In various embodiments, first IC dies of a first wafer may be sorted to determine known good first IC dies of the first wafer. The sorting may include performing one or more screening tests to determine the IC dies of the first wafer that pass the one or more screening tests (referred to as known good dies). The first wafer may be diced to singulate the first IC dies. The first wafer may be diced before or after the sorting.

In various embodiments, second IC dies of a second wafer may be sorted to determine known good second IC dies of the second wafer. The known good first IC dies may be bonded to respective known good second IC dies on the second wafer. In some embodiments, the known good first IC dies may be coupled to a carrier wafer at locations that correspond to locations of the known good second IC dies on the second wafer. The known good first IC dies may then be bonded as a group to the respective known good second IC dies of the second wafer, and the carrier wafer may be removed. In other embodiments, the known good first IC dies may be bonded one-by-one to the respective known good second IC dies.

In various embodiments, the known good first IC dies may be thinned (e.g., to reduce a thickness of the substrate) while the known good first IC dies are bonded to the second wafer. A dielectric may be formed on the second wafer between the known good first IC dies and/or on the known good first IC dies prior to thinning. In some embodiments, the dielectric material may have a mechanical property that matches the first IC die (e.g., that matches silicon). Accordingly, the stress field of the first IC dies may not be adversely impacted by the thinning process.

Additional processing may be performed on the stacked IC dies after bonding of the known good first IC dies to the known good second IC dies. For example, a redistribution layer, bump plating, and/or solder balls may be formed to enable first level interconnect attachment. In some embodiments, the die stacking process may be repeated to stack one or more additional dies on the stacked first and second dies.

In some embodiments; the first and second IC dies may be different circuit designs. In some non-limiting examples, the die stacking process described herein may be used for a) stacking an analog system on chip (SoC) die with a digital SoC die; b) stacking a non-silicon (e.g., gallium nitride (GaN)) die with a silicon (Si) SoC die; c) stacking a memory die with an SoC die; and/or d) stacking the same and/or different memory dies. Additionally, or alternatively, in some embodiments the first and second wafers may be of different diameters. For example, the diameter of the first wafer may be smaller than the diameter of the second wafer.

The die stacking process described herein may provide several advantages over prior techniques. The die stacking process may increase yield by bonding only known good first dies to known good second dies. By thinning the first dies while they are bonded to the second wafer, the die stacking process may enable the first dies to be thinned to a smaller thickness than was possible using prior techniques and/or may reduce warpage of a GaN substrate (e.g., GaN grown on Si) compared with thinning the substrate in wafer form. The reduced warpage may be due, at least in part; to the reduced area of the singulated dies compared with a whole wafer and/or the use of the dielectric material between the known good first dies. Additionally, or alternatively, the die stacking process described herein may enable dies of different diameter wafers to be efficiently stacked. If the dielectric material between the known good first dies has a mechanical property that is matched to the first dies (e.g., the substrate of the first dies), the dielectric material may prevent/reduce alteration of the stress field on the first dies.

If through-silicon vias (TSVs) are used, the ultra-thin die also offers advantage of low cost since the via formation and plating is significantly less complex (e.g., due to the lower aspect ratio).

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B), For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an example die 102 in wafer form 10 and in singulated form 100, in accordance with some embodiments. In some embodiments, the die 102 may be one of a plurality of dies (e.g., dies 102, 103a, 103b) of a wafer 11 composed of semiconductor material such as, for example, silicon or other suitable material. The plurality of dies may be formed on a surface of the wafer 11. Each of the dies may be a repeating unit of a semiconductor product that includes one or more ICs as described herein. For example, the wafer 11 may correspond to the first wafer (e.g., donor wafer) described herein and the dies 102, 103a, and 103b may correspond to the first IC dies (e.g., donor dies) described herein. The wafer 11 may alternatively correspond to the second wafer (e.g., mother wafer) described herein and the dies 102, 103a, and 103b may correspond to the second IC dies (e.g., mother dies) described herein.

In various embodiments, the die 102 may include circuitry having transistor structures 104 such as, for example, one or more channel bodies (e.g., fin structures, nanowires, planar bodies, etc.) that provide a channel pathway for mobile charge carriers of one or more transistor devices or source/drain regions. Transistor electrode assemblies (e.g., terminal contacts) may be formed on and coupled with the one or more transistor structures 104 to route electrical energy to or from the transistor structures 104. For example, terminal contacts may be electrically coupled with a channel body to provide a gate electrode for delivery of a threshold voltage and/or a source/drain current to provide mobile charge carriers for operation of a transistor device. Although the transistor structures 104 are depicted in rows that traverse a substantial portion of the die 102 in FIG. 1 for the sake of simplicity, it is to be understood that the transistor structures 104 may be configured in any of a wide variety of other suitable arrangements on the die 102 in other embodiments, including, for example, vertical and horizontal features having much smaller dimensions than depicted.

After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments, According to various embodiments, the transistor structures 104 may be disposed on a semiconductor substrate in wafer form 10 or singulated form 100. The transistor structures 104 described herein may be incorporated in a die 102 for logic or memory, or combinations thereof. In some embodiments, the transistor structures 104 may be part of a system-on-chip (SoC) assembly.

In various embodiments, dies of a first wafer may be sorted and singulated, and known good dies of the first wafer may be bonded to known good dies of a second wafer as described herein. The first wafer and/or second wafer may be similar to wafer 11.

Figure 2:
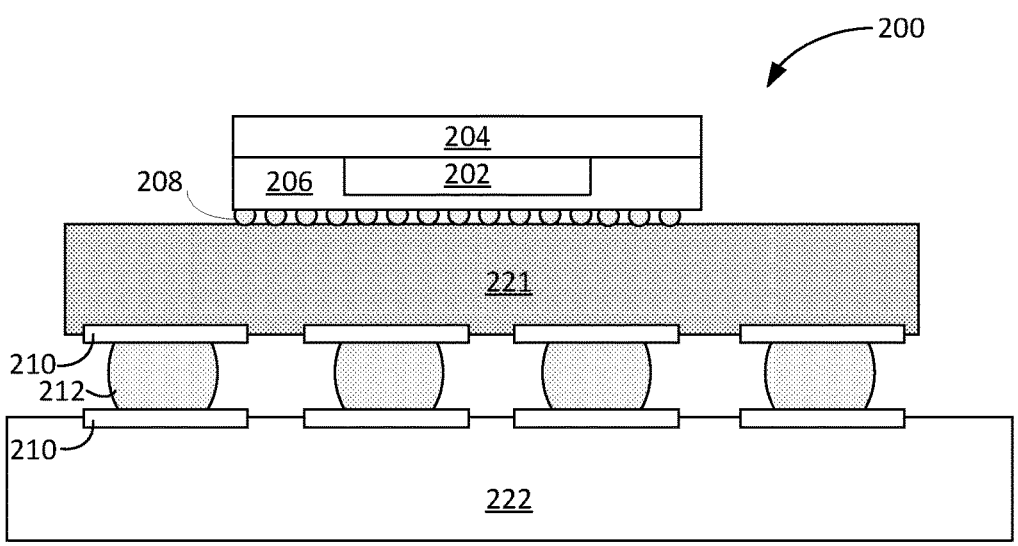
FIG. 2 schematically illustrates a cross-section side view of an integrated circuit (IC) assembly, in accordance with some embodiments.

FIG. 2 schematically illustrates a cross-section side view of an IC assembly 200, in accordance with some embodiments. In some embodiments, the IC assembly 200 may include an IC structure 201 electrically and/or physically coupled with a package substrate 221. In some embodiments, the package substrate 221 may be electrically coupled with a circuit board 222, as can be seen. In some embodiments, an IC assembly 200 may include one or more of the IC structure 201, package substrate 221 and/or circuit board 222, according to various embodiments. Embodiments described herein for an IC structure may be implemented in any suitable IC device according to various embodiments.

In various embodiments, the IC structure 201 may include stacked dies 202 and 203. The dies 202 and 204 may be stacked in accordance with the die stacking process described herein. The IC structure 201 may further include an interconnect layer 206 to route electrical signals between the package substrate 221 and the die 202 and/or die 204.

The IC structure 201 may be coupled to the package substrate 221 by die-level interconnect structures 208.

The dies 202 and/or 204 may represent a discrete product made from a semiconductor material (e.g., silicon) using semiconductor fabrication techniques such as thin film deposition, lithography, etching and the like used in connection with forming CMOS devices. In some embodiments, the dies 202 and/or 204 may be, include, or be a part of a processor, memory, SoC or ASIC. In some embodiments, an electrically insulative material such as, for example, molding compound or underfill material (not shown) may encapsulate at least a portion of the IC structures and/or die-level interconnect structures 208.

The IC structure 201 can be attached to the package substrate 221 according to a wide variety of suitable configurations including, for example, being directly coupled with the package substrate 221 in a flip-chip configuration, as depicted. In the flip-chip configuration, an active side of the IC structure 201 including circuitry is attached to a surface of the package substrate 221 using die-level interconnect structures 208 such as bumps, pillars, or other suitable structures that may also electrically couple the die 202 and/or die 204 with the package substrate 221.

The interconnect layer 206 may include interconnect structures that are configured to route electrical signals to or from the active devices in the die 202 and/or die 204. For example, the interconnect layer 206 may include horizontal lines (e.g., trenches) and/or vertical plugs (e.g., vias) or other suitable features to provide electrical routing and/or contacts.

In some embodiments, the die-level interconnect structures 208 may be electrically coupled with the interconnect layer 206 and configured to route electrical signals between the dies 202/204 and other electrical devices. The electrical signals may include, for example, input/output (I/O) signals and/or power/ground signals that are used in connection with operation of the dies 202/204.

In some embodiments, the package substrate 221 may be an epoxy-based laminate substrate having a core and/or build-up layers such as, for example, an Ajinomoto Build-up Film (ABF) substrate. The package substrate 221 may include other suitable types of substrates in other embodiments including, for example, substrates formed from glass, ceramic, or semiconductor materials.

The package substrate 221 may include electrical routing features configured to route electrical signals to or from the IC structure 201. The electrical routing features may include, for example, pads or traces (not shown) disposed on one or more surfaces of the package substrate 221 and/or internal routing features (not shown) such as, for example, trenches, vias or other interconnect structures to route electrical signals through the package substrate 221. For example, in some embodiments, the package substrate 221 may include electrical routing features such as pads (not shown) configured to receive the respective die-level interconnect structures 208.

The circuit board 222 may be a printed circuit board (PCB) composed of an electrically insulative material such as an epoxy laminate. For example, the circuit board 222 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the dies 202/204 through the circuit board 222. The circuit board 222 may be composed of other suitable materials in other embodiments. In some embodiments, the circuit board 222 is a motherboard (e.g., motherboard 602 of FIG. 6).

Package-level interconnects such as, for example, solder balls 212 may be coupled to one or more pads (hereinafter "pads 110") on the package substrate 221 and/or on the circuit board 222 to form corresponding solder joints that are configured to further route the electrical signals between the package substrate 221 and the circuit board 222. The pads 210 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 221 with the circuit board 222 may be used in other embodiments.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations, Other suitable techniques to route electrical signals between the die 102 and other components of the IC assembly 200 may be used in some embodiments.

Figure 3:
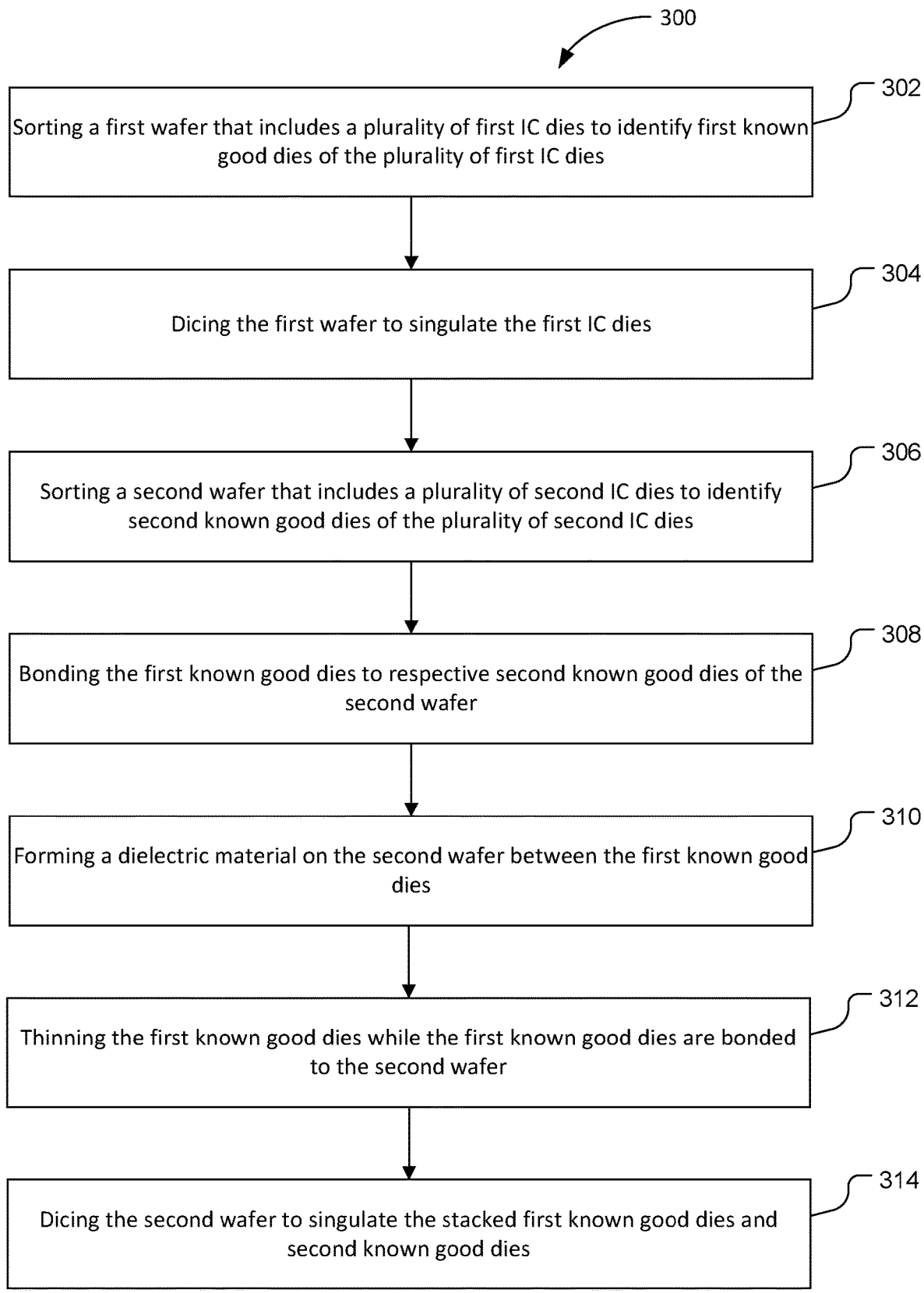
FIG. 3 is a flow diagram that illustrates a process for stacking IC dies, in accordance with some embodiments.

FIG. 3 is an illustrative flow diagram of a process 300 for forming a stacked IC structure in accordance with various embodiments. The stacked IC structure may include a first die and a second die coupled to one another in a stacked orientation.

At block 302, the method 300 may include sorting a first wafer that includes a plurality of first IC dies to identify first known good dies of the plurality of first IC dies. The sorting may include performing one or more screening tests to determine whether individual first IC dies are to be used or discarded. For example, the first IC dies that pass the one or more screening tests may be used (and may be identified as known good dies), while the first IC dies that fail one or more of the screening tests may be discarded. Some example screening tests may include, but are not limited to, visual inspection (e.g., to monitor for aesthetic quality, warpage, cracking, and/or solder separation) and/or electrical testing (e.g., testing electrical characteristics at contacts/pads, such as pad capacitance).

At block 304, the method 300 may include dicing the first wafer to singulate the first IC dies. The first wafer may be diced before or after the sorting at block 302.

At block 306, the method 300 may include sorting a second wafer that includes a plurality of second IC dies to identify second known good dies of the plurality of second IC dies. The sorting may include performing one or more screening tests to determine whether individual second IC dies of the second wafer are to be used or discarded. Some example screening tests may include, but are not limited to, visual inspection (e.g., to monitor for aesthetic quality, warpage, cracking, and/or solder separation) and/or electrical testing (e.g., testing electrical characteristics at contacts/pads, such as pad capacitance). In some embodiments, the second IC dies of the second wafer may be different (e.g., including different circuitry/functionality) than the first IC dies of the first wafer. In some embodiments, the second IC dies of the second wafer may be a different size (e.g., in area) than the first IC dies of the first wafer. For example, the second IC dies of the second wafer may be larger than the first IC dies of the first wafer. Additionally, or alternatively, the first and second wafers may be different sizes (e.g., diameters). For example, in some embodiments, the second wafer may be larger than the first wafer.

Furthermore, in some embodiments, a substrate of the first wafer may be different than a substrate of the second wafer. In one non-limiting example, the first wafer may be a GaN wafer (e.g., with a layer of GaN on Si) and the second wafer may be a Si wafer.

At block 308, the method 300 may include bonding the first known good dies from the first wafer to respective second known good dies of the second wafer. The bonding may be, for example, metal-to-metal bonding (e.g., copper-to-copper) or solder bonding (e.g., using plated Sn-2.5 wt. % Ag solder to bond onto metal pads, such as Cu or Ni surface finishes). The under solder metallization may also be Cu or Ni. In some embodiments, the first known good dies of the first wafer may be temporarily coupled to a carrier wafer in locations that correspond to second known good dies of the second wafer. The plurality of first known good dies on the carrier wafer may then be bonded as a group to the respective second known good dies of the second wafer. The carrier wafer may be released to leave the first known good dies coupled to the second wafer. In other embodiments, the first known good dies may be bonded one-by-one to the respective second known good dies of the second wafer.

In some embodiments, after the first known good dies are bonded to the respective second known good dies of the second wafer, the first known good dies may be thinned. For example, at 310, the method 300 may include forming a dielectric material (e.g., a hard dielectric) on the second wafer between the first known good dies. In some embodiments, the dielectric material may also be formed on the first known good dies. Forming the dielectric material may include, for example, spinning on a dielectric. The dielectric material may be any suitable material, such as silicon dioxide ($SiO_2$) or another dielectric material. The dielectric material may be selected to have mechanical properties similar to the substrate of the first IC dies (e.g., Si).

At 312, the method 300 may include thinning the first known good dies while the first known good dies are bonded to the second wafer. The dies may be thinned by any suitable process, such as using one or more of mechanical grinding, etching, or chemical mechanical planarization (CMP). The dies may be thinned to any suitable thickness. For example, in some embodiments, the dies may be thinned to leave only about a few micrometers of the semiconductor substrate (e.g., with the device layer disposed below the semiconductor substrate). The dielectric material formed at block 310 may protect the known good first dies from damage during the thinning at block 312.

In some embodiments, one or more TSVs may be formed through the die from the first wafer to provide electrical access to the die of the second wafer. In other embodiments, TSVs may not be formed.

In other embodiments, the method 300 may not include operations 310 and 312 to thin the known good dies from the first wafer after bonding the dies to the second wafer.

At 314, the method 300 may include dicing the second wafer to singulate the stacked dies (e.g., including a first known good die from the first wafer coupled with a second known good die from the second wafer in a stacked configuration).

FIGS. 4A-4J schematically illustrate IC devices during various aspects of a process for forming a stacked IC structure in accordance with various embodiments. The process may correspond to the process 300 in some embodiments. For ease of understanding, not all elements may be labeled in every one of FIGS. 4A-4J.

Figure 4A:
FIGS. 4A-4J schematically illustrate IC structures at various stages of a process for fabricating an IC device with stacked dies, in accordance with some embodiments.

FIG. 4A illustrates a mother wafer 402 including a die 404. The mother wafer 402 may include a plurality of dies, including the die 404. The plurality of dies may be repeating units of an IC device. In some embodiments, the mother wafer 402 may correspond to the second wafer described with respect to the process 300. The die 404 may include a substrate 406, a device layer 408, and a first metal layer 410 disposed on the device layer 408.

Figure 4B:
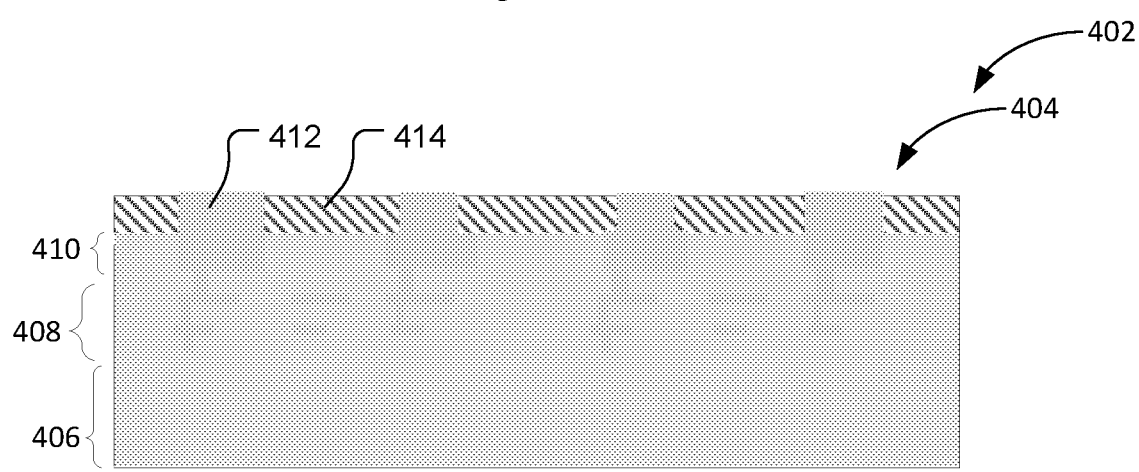

FIG. 4B illustrates the mother wafer 402 subsequent to patterning and formation of interconnects 412 on the first metal layer 410. A dielectric 414 may be disposed between the interconnects 412. In various embodiments, the mother wafer 402 may be sorted (e.g., to identify known good dies) subsequent to formation of the interconnects 412. In other embodiments, the first wafer 402 may alternatively or additionally be sorted at a different stage of the fabrication process. The mother wafer 402 may be sorted, for example, using the sorting process described above with respect to block 306 of process 300.

Figure 4C:
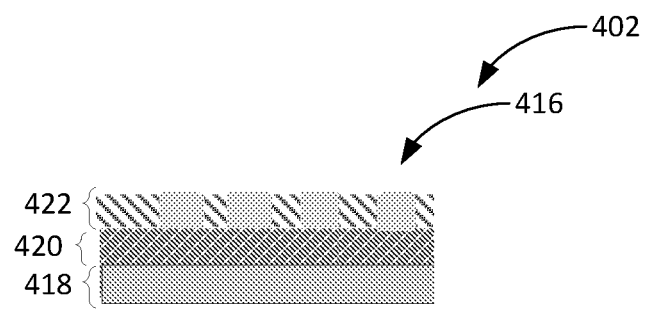

FIG. 4C illustrates a donor die 416 of a donor wafer. The donor wafer may be sorted and diced to provide a plurality of dies 416 that are known good dies. The dies 416 may include a substrate 418, a device layer 420, and an interconnect layer 422.

Figure 4D:
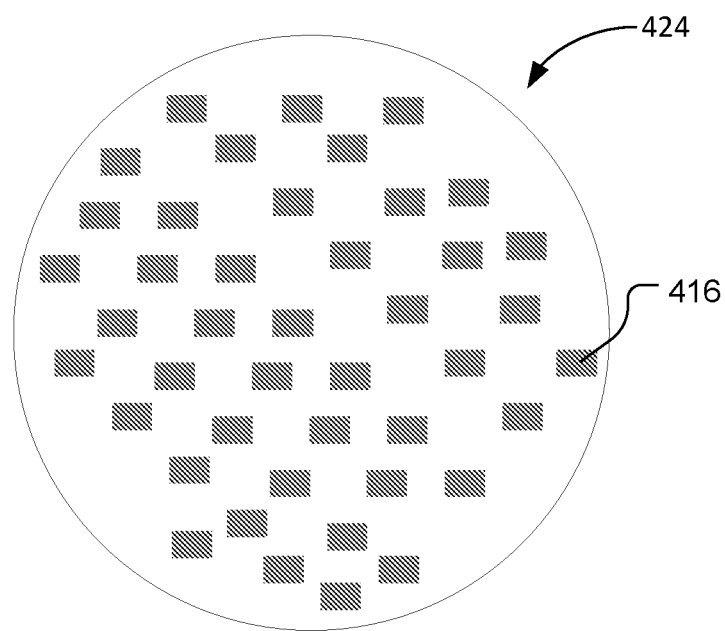

In some embodiments, a plurality of known good dies 416 may be arranged on a carrier wafer in locations that correspond to known good dies of the mother wafer 402. For example, FIG. 4D illustrates a carrier wafer 424 with a plurality of known good dies 416 disposed thereon. The known good dies 416 may be temporarily bonded to the carrier wafer 424 (e.g., using a releasable adhesive).

Figure 4E:
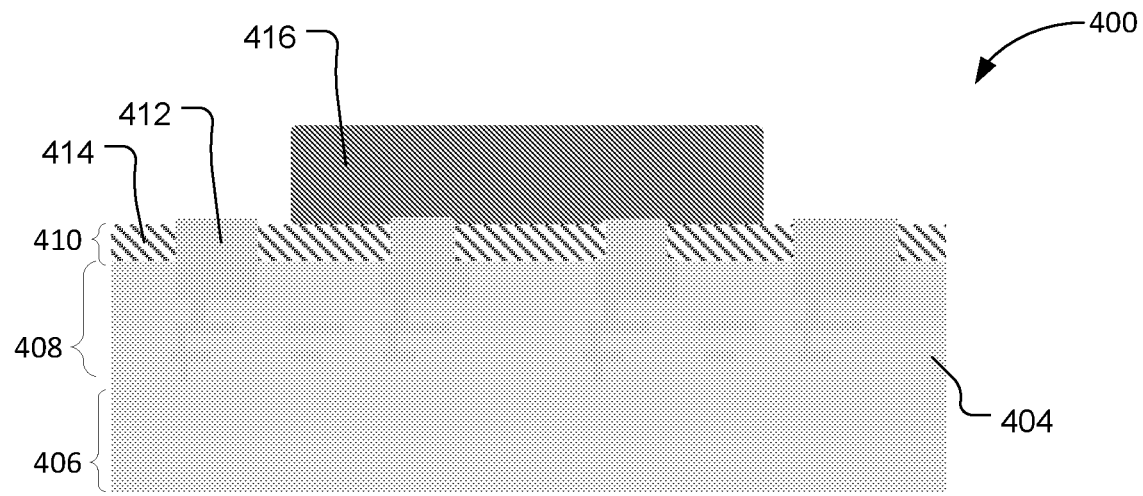

In various embodiments, the known good dies 416 of the carrier wafer 424 may be bonded to the known good dies 404 of the mother wafer 402. The carrier wafer 424 may be released from the dies 416 to leave the dies 416 bonded to the known good dies 404. For example, FIG. 4E illustrates an IC structure 400 that includes a known good die 416 bonded to a known good die 404 (e.g., on the interconnect layer). The die 416 may be bonded to the die 404 by any suitable bonding mechanism, such as copper-to-copper bonding or dielectric-to-dielectric bonding.

The substrate 418, a device layer 420, and an interconnect layer 422 of the die 416 as shown in FIG. 4C are not shown in FIGS. 4E-4K. The die 416 may be bonded to the die 404 with the interconnect layer 422 facing the die 404 and the substrate 418 facing away from the die 404. It will be apparent that other arrangements may be used in other embodiments.

In other embodiments, the known good dies 416 of the donor wafer may be bonded one-by-one to the known good dies 404 of the mother wafer 402, instead of using the carrier wafer 424 to bond a plurality of dies 416 to the mother wafer 402 simultaneously.

In various embodiments, after bonding the known good dies 416 to the known good dies 404 of the mother wafer 402, a dielectric may be formed on the known good dies 416 and on the mother wafer 402 between the known good dies. The dielectric may be, for example, a spin-on dielectric (e.g., SiO2). The known good dies 416 may be thinned subsequent to formation of the dielectric. The known good dies 416 may be thinned by any suitable process, such as using one or more of CMP, etching, and/or mechanical grinding. The known good dies 416 may be thinned to any suitable thickness. For example, in some embodiments, the known good dies 416 may be thinned to leave the substrate (e.g., substrate 418) with a thickness of 5 microns or less, such as 1-2 microns.

In some embodiments, a first thinning process may be performed on the dies 416 in wafer form (e.g., when part of the donor wafer). A second thinning process may be performed while the known good dies 416 are bonded to the mother wafer 402 to further reduce the thickness of the substrate of the dies 416. The process described herein may enable the thickness of the dies 416 and/or substrate 418 to be lower than was possible for prior pick-and-place methods for die stacking.

Figure 4F:
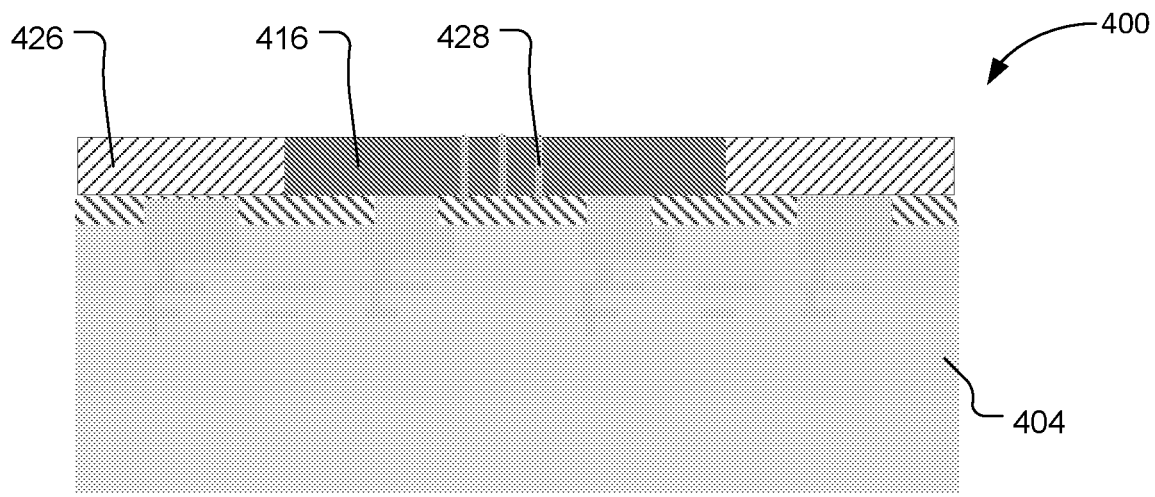

In some embodiments, one or more through-silicon vias (TSVs) may be formed on the dies 416 after thinning. FIG. 4F illustrates the IC structure 400 subsequent to formation of a spin-on dielectric 426 on the mother wafer 402 between the known good dies 416, thinning of the dies 416, and formation of TSVs 428. Other embodiments may not use TSVs, as discussed further below with respect to FIGS. 5A-5E.

Figure 4G:
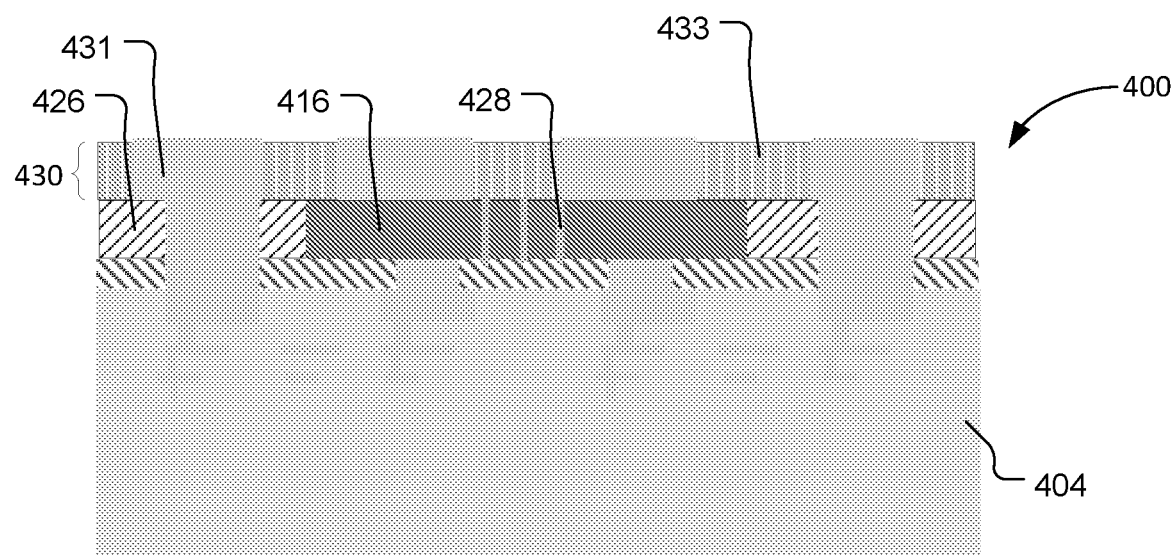

FIG. 4G illustrates the IC structure 400 subsequent to formation of a redistribution layer 430 on the die 416 and dielectric 426. The redistribution layer 430 may include routing features 431 to fan out to the pitches of a first level interconnect. The redistribution layer 430 may include routing features 431 coupled to the TSVs 428, as shown. The redistribution layer may further include a dielectric material 433 disposed between the routing features 431. The dielectric material 433, dielectric 426, and dielectric 414 may be the same material or different materials.

Figure 4H:
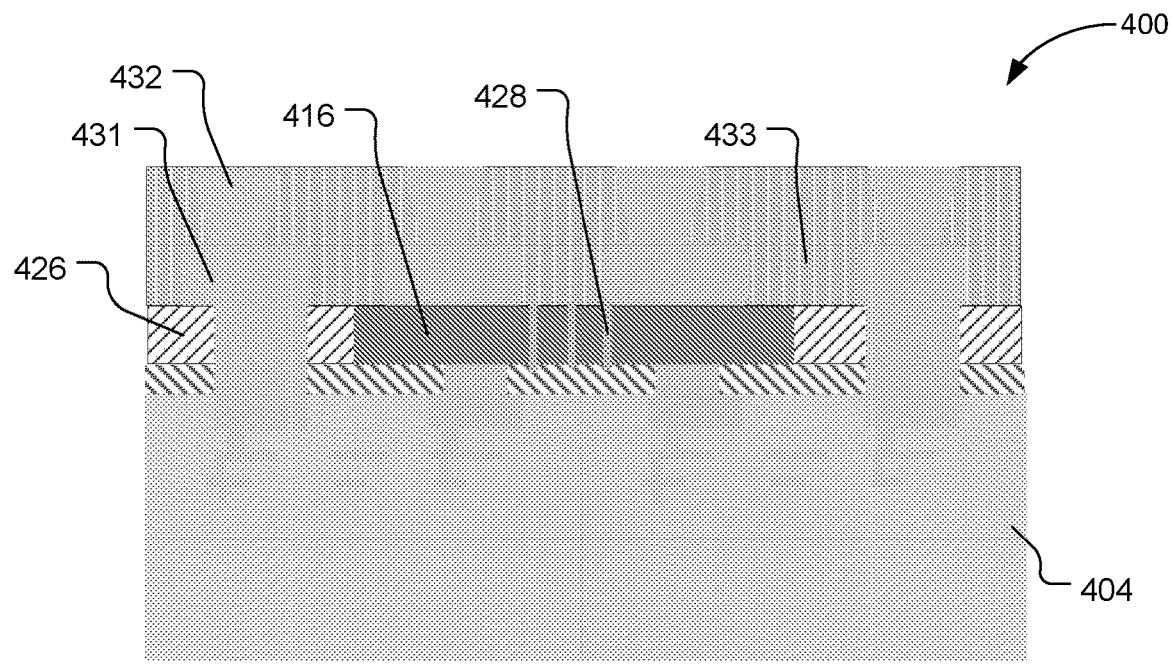

FIG. 4H illustrates the IC structure 400 subsequent to formation and/or opening of vias 432. The vias 432 may provide an electrical connection between the redistribution layer 430 and the die 404 and/or die 416.

Figure 4I:
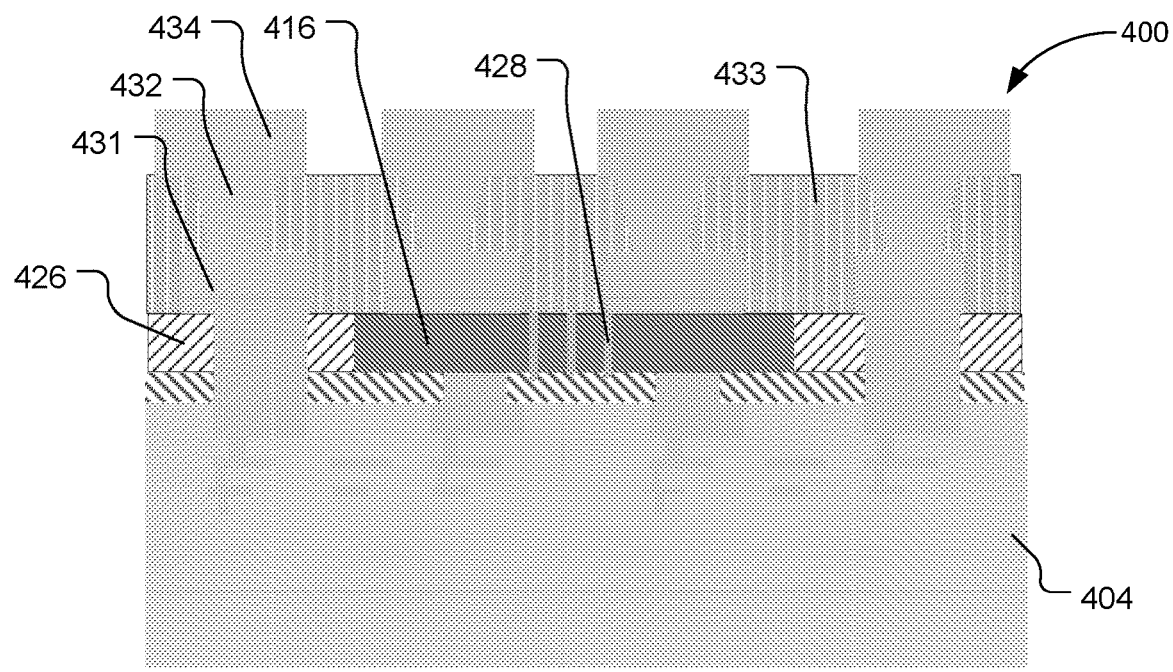

FIG. 4I illustrates the IC structure 400 subsequent to formation of bump plating 434 (e.g., copper bump plating).

In various embodiments, after the operations illustrated by FIGS. 4A-4I, the mother wafer 402 may be diced. In some embodiments, the mother wafer 402 may additionally be thinned (e.g., to reduce the thickness of the substrate). The singulated IC structure 400 (e.g., including the die 416 stacked with the die 404) may be coupled to a circuit board (e.g., in a flip-chip configuration).

Figure 4J:
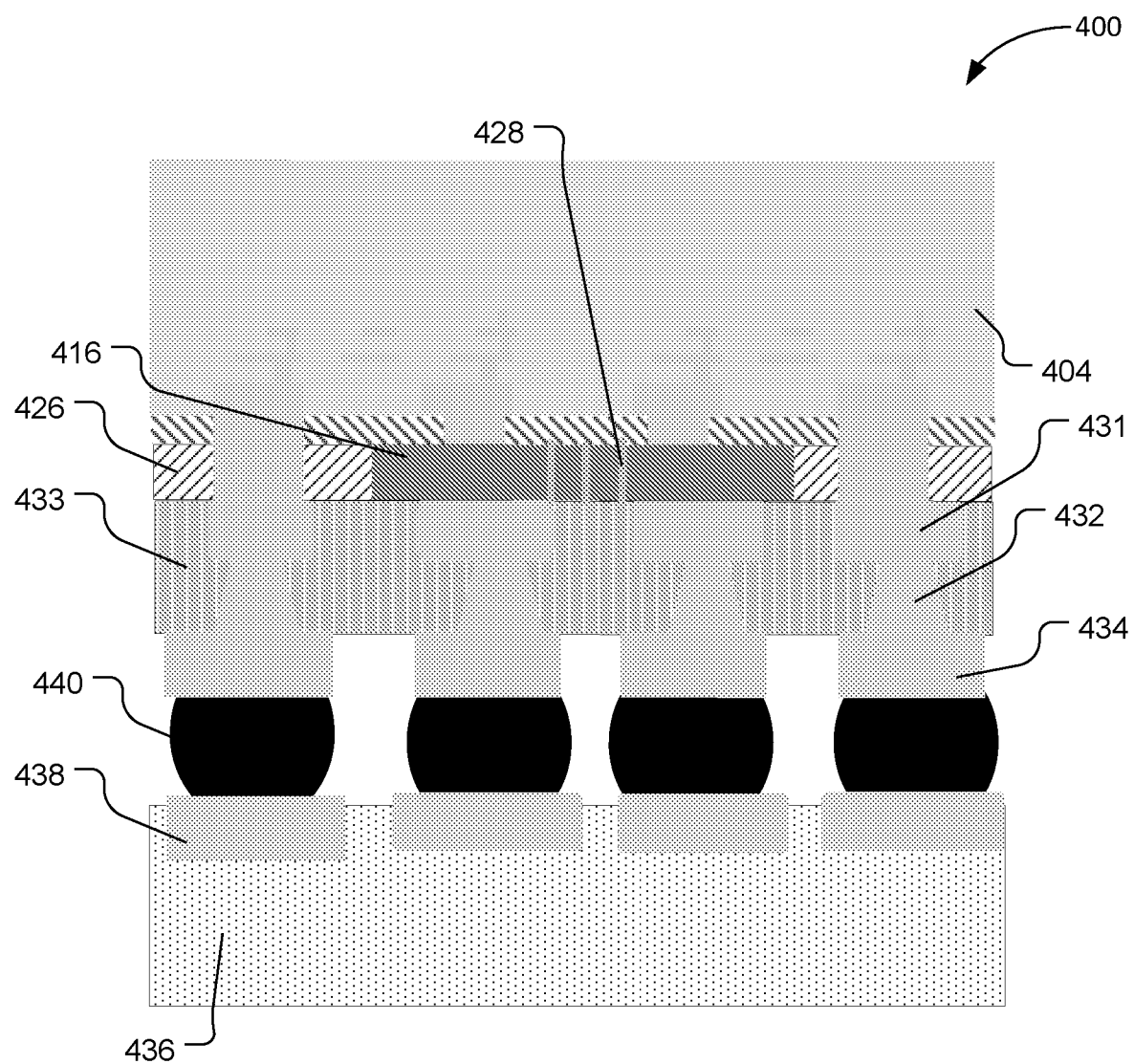

FIG. 4J illustrates the IC structure 400 subsequent to the stacked dies 416 and 404 being coupled to a package-level substrate 436. The bump plating 434 of the IC structure 400 may be coupled with contacts 438 of the package-level substrate 436 by solder balls 440. It will be apparent that other configurations may be used in other embodiments.

Figure 5A:
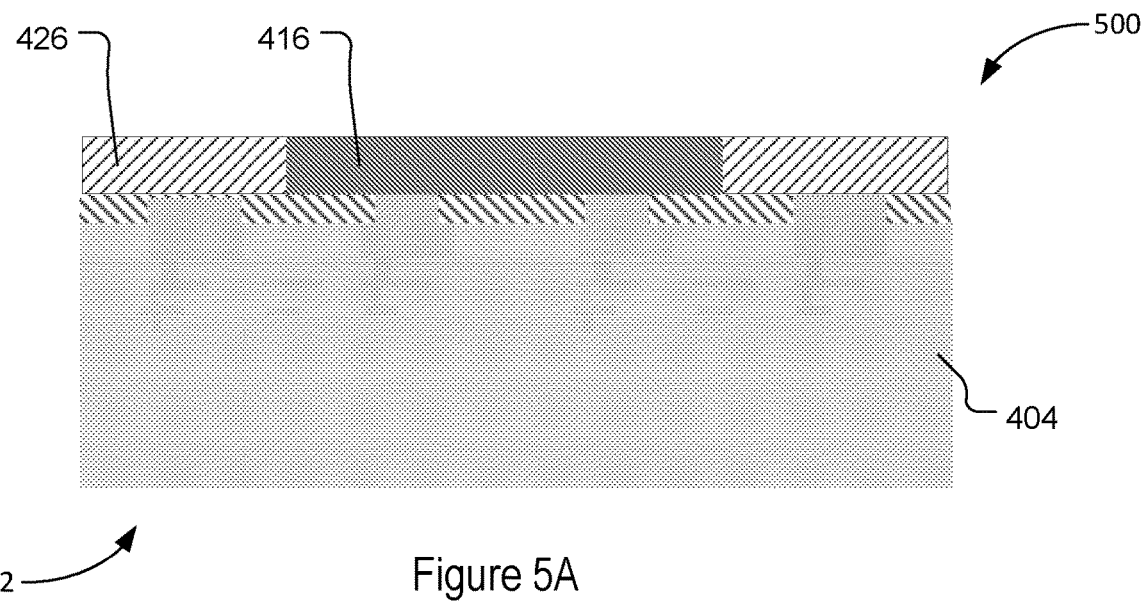
FIGS. 5A-5E schematically illustrate cross-section side views of various stages of another process for fabricating an IC device with stacked dies, in accordance with some embodiments.

In some embodiments, as discussed above, no TSVs may be formed in the die 416. For example, if the mother die 404 is not bump/routing area limited, no TSVs may be needed. FIG. 5A illustrates an IC structure 500 that may be formed by a similar process to the process described above with respect to FIGS. 4A-4F, except that no TSVs may be formed in the dies 416. The IC structure 500 is shown in FIG. 5A subsequent to formation of a spin-on dielectric 426 on the mother wafer 402 between the known good dies 416 and thinning of the dies 416.

Figure 5B:
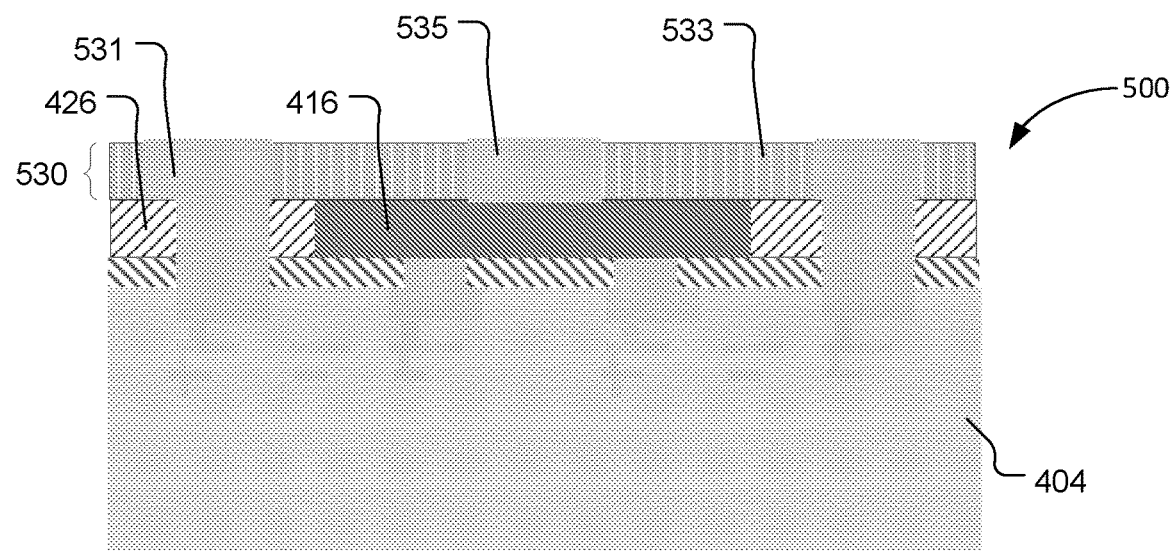

FIG. 5B illustrates the IC structure 500 subsequent to formation of a redistribution layer 530 on the die 416 and dielectric 426. The redistribution layer 530 may include routing features 531 to fan out to the pitches of a first level interconnect of the IC structure 500. The redistribution layer may further include a dielectric 533 between the routing features 531. The redistribution layer 530 may not include shadow TSV routing features, since no TSVs are used.

However, in some embodiments, the redistribution layer 530 may include a thermal routing feature 535 to provide heat dissipation. The thermal routing feature 535 may include a conductor similar to the routing features 531.

Figure 5C:
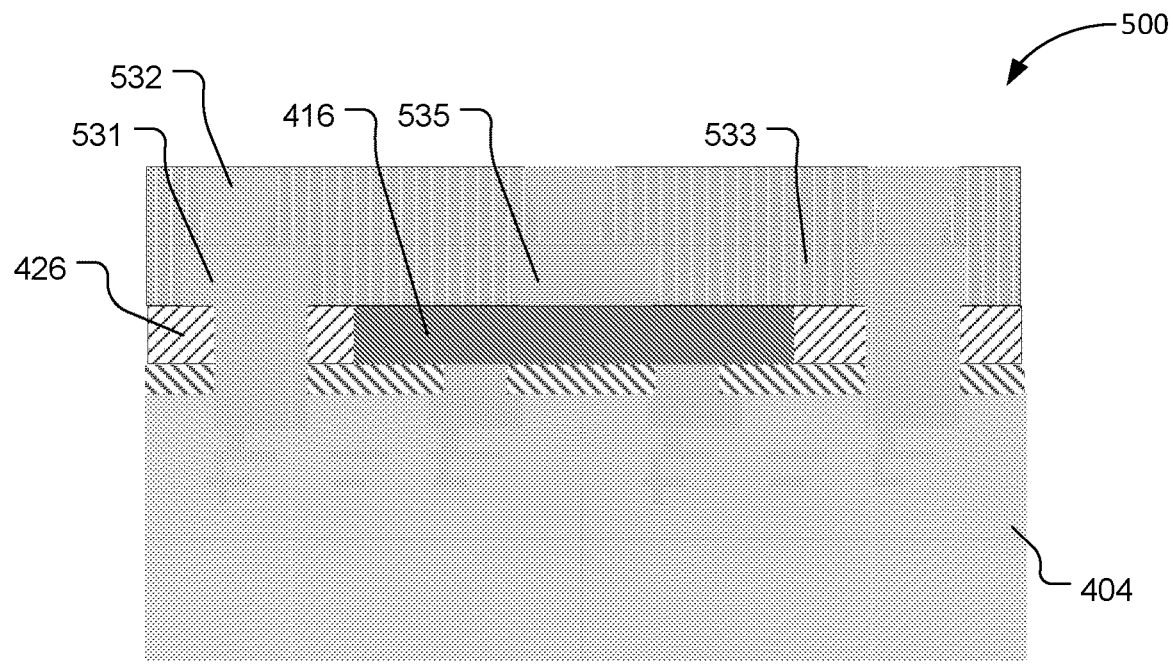

FIG. 5C illustrates the IC structure 500 subsequent to formation and/or opening of vias 532. The vias 532 may provide an electrical connection between the redistribution layer 530 and the die 404 and/or die 416.

Figure 5D:
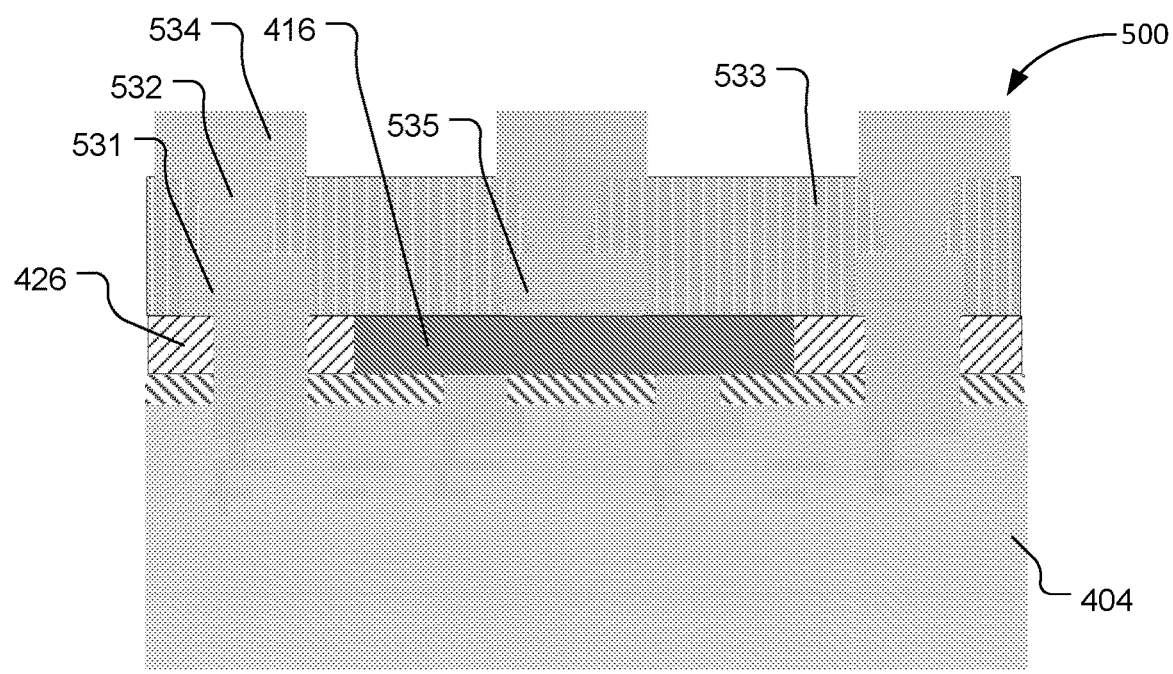

FIG. 5D illustrates the IC structure 500 subsequent to formation of bump plating 534 (e.g., copper bump plating). The middle bump shown in FIG. 5D (e.g., the bump disposed in the shadow of the die 416) may be used for heat dissipation.

In various embodiments, after the operations illustrated by FIGS. 4A-4E and 5A-5D, the mother wafer 402 may be diced. In some embodiments, the mother wafer 402 may additionally be thinned (e.g., to reduce the thickness of the substrate). The singulated IC structure 500 (e.g., including the die 416 stacked with the die 404) may be coupled to a circuit board (e.g., in a flip-chip configuration).

Figure 5E:
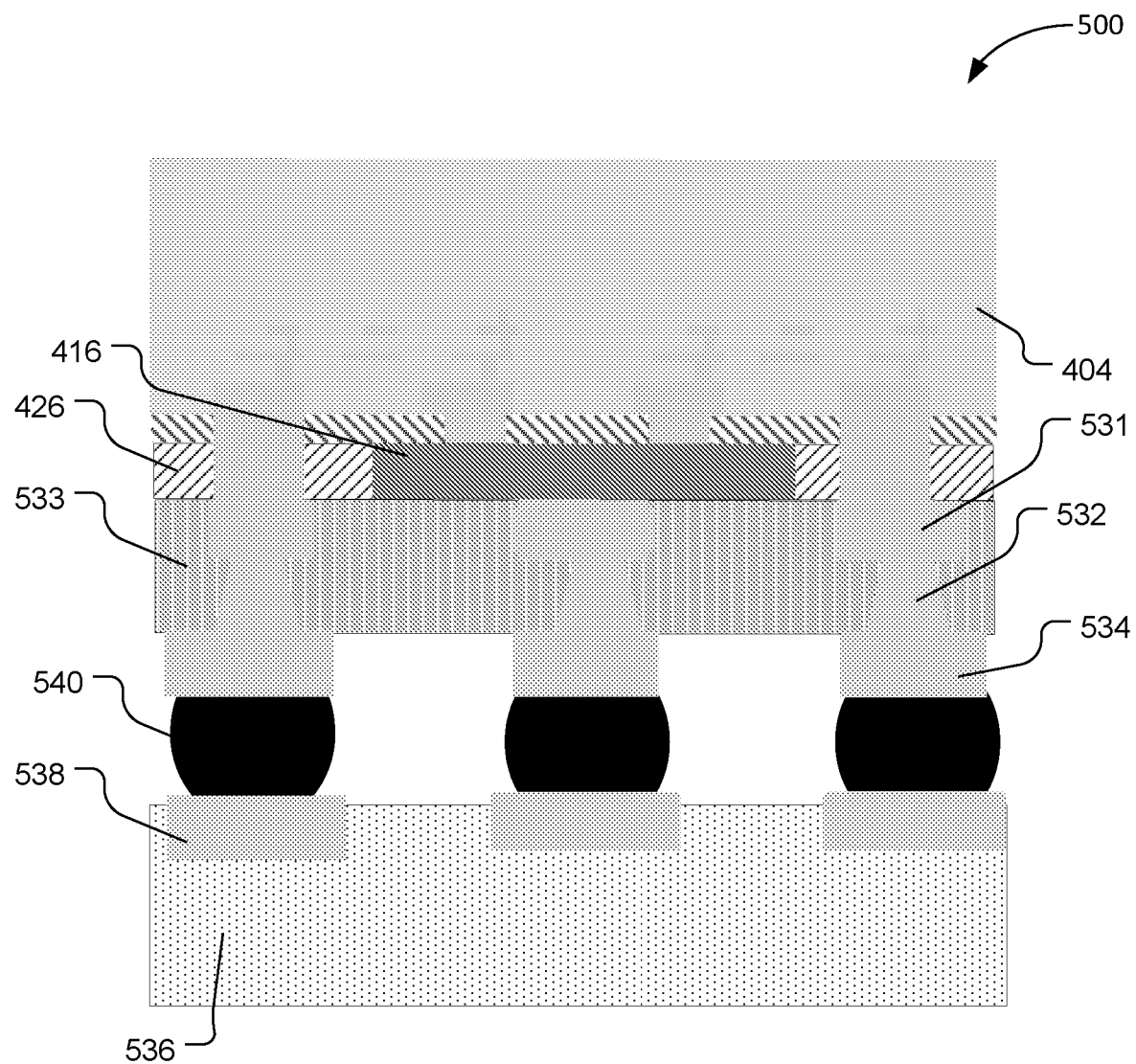

FIG. 5E illustrates the IC structure 500 subsequent to the stacked dies 416 and 404 being coupled to a circuit board 536. The bump plating 534 of the IC structure 500 may be coupled with contacts 538 of the circuit board 536 by solder balls 540. It will be apparent that other configurations may be used in other embodiments.

Figure 6:
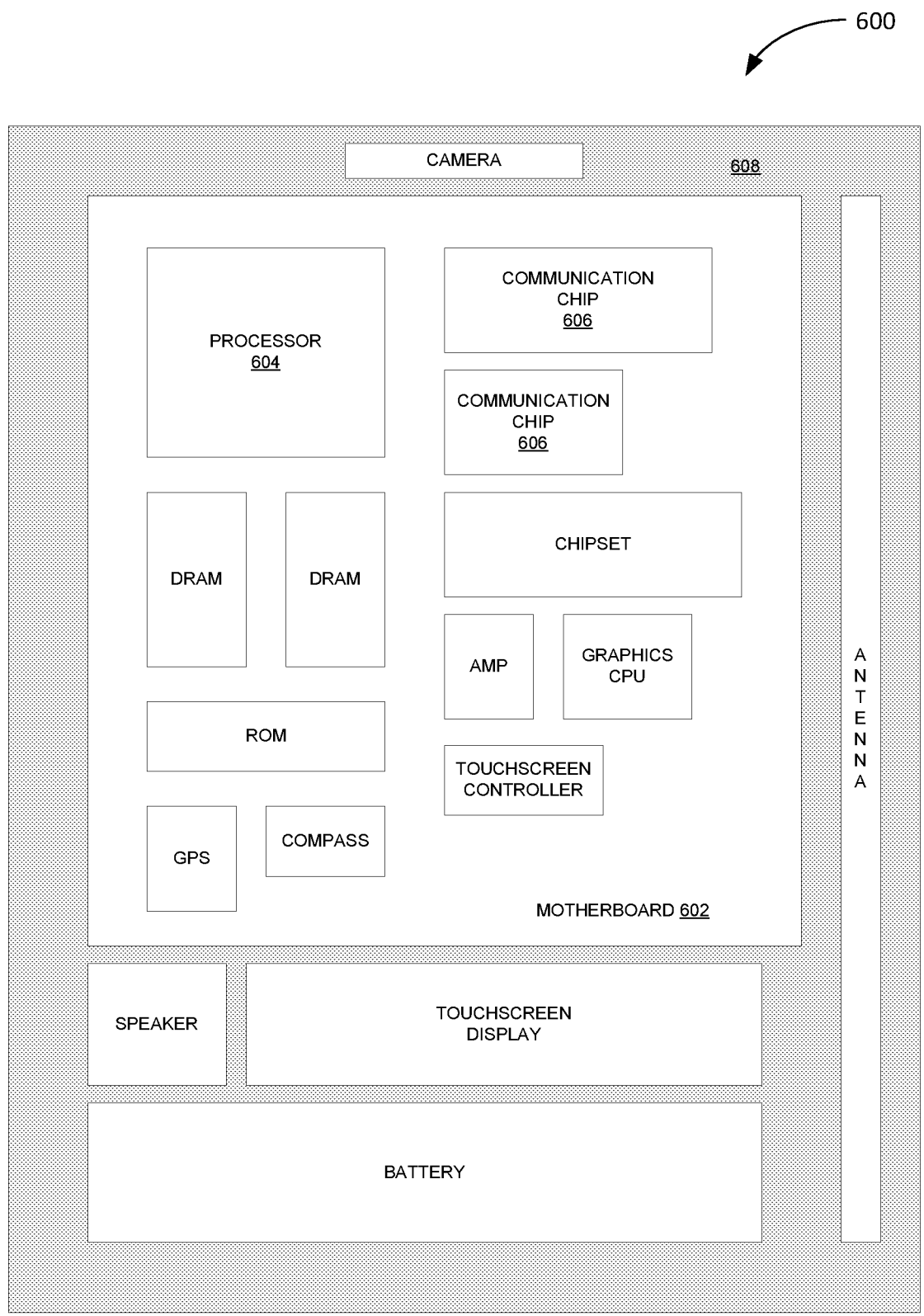
FIG. 6 schematically illustrates an example system that may include an IC device as described herein, in accordance with some embodiments.

FIG. 6 schematically illustrates an example system (e.g., computing device 600) that may include an IC structure (e.g., IC structure 400, IC structure 500, and/or an IC structure fabricated using the process 300) as described herein, in accordance with some embodiments. Components of the computing device 600 may be housed in an enclosure (e.g., housing 608). The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, EV-DO, and others.

The processor 604 of the computing device 600 may include and/or be part of an IC structure including stacked dies as described herein (e.g., the IC structure 400, IC structure 500, and/or an IC structure fabricated using the process 300). For example, the die 102 of FIG. 2 may be mounted in a package assembly (e.g., package assembly 200) that is mounted on a circuit board such as the motherboard 602. The term "processor" may refer to any device or portion of a device that processes electronic data from registers and/or memory to transform that electronic data into other electronic data that may be stored in registers and/or memory.

The communication chip 606 may also include and/or be part of an IC structure including stacked dies as described herein (e.g., the IC structure 400, IC structure 500, and/or an IC structure fabricated using the process 300). In further implementations, another component (e.g., memory device or other integrated circuit device) housed within the computing device 600 may include and/or be part of an IC structure including stacked dies as described herein (e.g., the IC structure 400, IC structure 500, and/or an IC structure fabricated using the process 300).

In various implementations, the computing device 600 may be a mobile computing device, a laptop, a netbook, a notebook, an ultrabook, a smartphone, a tablet, a personal digital assistant (FDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some non-limiting Examples are provided below.

Example 1 is a method for fabricating a stacked integrated circuit (IC) device, the method comprising: sorting a first wafer that includes a plurality of first IC dies to identify first known good dies of the plurality of first IC dies; dicing the first wafer to singulate the first IC dies; sorting a second wafer that includes a plurality of second IC dies to identify second known good dies of the plurality of second IC dies; and bonding the first known good dies to respective second known good dies of the second wafer.

Example 2 is the method of Example 1, further comprising: arranging the first known good dies on a carrier wafer in locations that correspond to locations of the second known good dies on the second wafer; wherein the bonding includes bonding the first known good dies arranged on the carrier wafer to the respective second known good dies and removing the carrier wafer.

Example 3 is the method of Example 1, further comprising, after the bonding, thinning the first known good dies while the first known good dies are bonded to the second wafer.

Example 4 is the method of Example 3, further comprising, prior to the thinning, forming a dielectric on the second wafer between the first known good dies.

Example 5 is the method of Example 3, wherein the thinning includes thinning the first dies to a thickness of 30 microns or less.

Example 6 is the method of any one of Examples 1 to 5, wherein a diameter of the first wafer is smaller than a diameter of the second wafer.

Example 7 is the method of any one of Examples 1 to 5, wherein the first IC dies are of a different circuit design than a circuit design of the second IC dies.

Example 8 is the method of any one of Examples 1 to 5, further comprising forming one or more through-silicon vias (TSVs) in the first known good dies.

Example 9 is the method of any one of Examples 1 to 5, wherein the first die includes a gallium nitride (GaN) on silicon (Si) substrate.

Example 10 is the method of any one of Examples 1 to 5; further comprising forming one or more thermal vias coupled with individual first known good dies.

Example 11 is a method for fabricating a stacked integrated circuit device; the method comprising: sorting a mother wafer that includes a plurality of mother IC dies to identify known good mother dies of the plurality of mother IC dies; bonding donor dies to respective known good mother dies of the mother wafer; forming a dielectric on the mother wafer between the donor dies; and thinning the donor dies while the donor dies are bonded to the mother wafer.

Example 12 is the method of Example 11, further comprising: sorting the donor dies prior to bonding the donor dies to the respective known good mother dies to determine known good donor dies.

Example 13 is the method of Example 11, further comprising: arranging the donor dies on a carrier wafer in locations that correspond to locations of the known good mother dies on the mother wafer; wherein the bonding includes bonding the donor dies arranged on the carrier wafer to the respective known good mother dies and removing the carrier wafer.

Example 14 is the method of Example 11, wherein the thinning includes thinning the donor dies to a thickness of 25 microns or less.

Example 15 is the method of Example 11, further comprising singulating the donor dies from a donor wafer, wherein a diameter of the donor wafer is smaller than a diameter of the mother wafer.

Example 16 is the method of Example 11, wherein the donor dies are of a different circuit design than a circuit design of the mother dies.

Example 17 is the method of any one of Examples 11 to 16, further comprising forming one or more through-silicon vias (TSVs) in the donor dies after the bonding.

Example 18 is the method of any one of Examples 11 to 16, wherein a substrate of the donor dies includes gallium nitride.

Example 19 is the method of any one of Examples 11 to 16, first comprising forming one or more thermal vias coupled with individual donor dies.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method for fabricating a stacked integrated circuit (IC) device, the method comprising:
    sorting a first wafer that includes a plurality of first IC dies to identify first known good dies of the plurality of first IC dies;
    dicing the first wafer to singulate the first IC dies;
    sorting a second wafer that includes a plurality of second IC dies to identify second known good dies of the plurality of second IC dies; and
    bonding the first known good dies to respective second known good dies of the second wafer;
    thinning the first known good dies while the first known good dies are bonded to the second wafer; and
    forming one or more through-silicon vias (TSVs) in the first known good dies after the thinning and while the first known good dies are bonded to the second wafer.

2. The method of claim 1, further comprising:
    arranging the first known good dies on a carrier wafer in locations that correspond to locations of the second known good dies on the second wafer;
    wherein the bonding includes bonding the first known good dies arranged on the carrier wafer to the respective second known good dies and removing the carrier wafer.

3. The method of claim 1, further comprising, prior to the thinning, forming a dielectric on the second wafer between the first known good dies.

4. The method of claim 1, wherein the thinning includes thinning the first dies to a thickness of 30 microns or less.

5. The method of claim 1, wherein a diameter of the first wafer is smaller than a diameter of the second wafer.

6. The method of claim 1, wherein the first IC dies are of a different circuit design than a circuit design of the second IC dies.

7. The method of claim 1, wherein the first die includes a gallium nitride (GaN) on silicon (Si) substrate.

8. The method of claim 1, further comprising forming one or more thermal vias coupled with individual first known good dies.

9. A method for fabricating a stacked integrated circuit device, the method comprising:
    sorting a mother wafer that includes a plurality of mother IC dies to identify known good mother dies of the plurality of mother IC dies;
    bonding donor dies to respective known good mother dies of the mother wafer;
    forming a dielectric on the mother wafer between the donor dies; and
    thinning the donor dies while the donor dies are bonded to the mother wafer; and
    forming one or more through-silicon vias (TSVs) in the donor dies after the thinning.

10. The method of claim 9, further comprising:
    sorting the donor dies prior to bonding the donor dies to the respective known good mother dies to determine known good donor dies.

11. The method of claim 9, further comprising:
    arranging the donor dies on a carrier wafer in locations that correspond to locations of the known good mother dies on the mother wafer;
    wherein the bonding includes bonding the donor dies arranged on the carrier wafer to the respective known good mother dies and removing the carrier wafer.

12. The method of claim 9, wherein the thinning includes thinning the donor dies to a thickness of 25 microns or less.

13. The method of claim 9, further comprising singulating the donor dies from a donor wafer, wherein a diameter of the donor wafer is smaller than a diameter of the mother wafer.

14. The method of claim 9, wherein the donor dies are of a different circuit design than a circuit design of the mother dies.

15. The method of claim 9, wherein a substrate of the donor dies includes gallium nitride.

16. The method of claim 9, first comprising forming one or more thermal vias coupled with individual donor dies.

* * * * *